United States Patent
Lin (10) Patent No.: US 11,693,519 B2
(45) Date of Patent: Jul. 4, 2023

(54) PROXIMITY SENSOR AND PROXIMITY SENSING METHOD

(71) Applicant: SITRONIX TECHNOLOGY CORP., Jhubei (TW)

(72) Inventor: Chih-Yu Lin, Jhubei (TW)

(73) Assignee: Sensortek Technology Corp., Zhubei (TW)

( * ) Notice: Subject to any disclaimer, the term of this patent is extended or adjusted under 35 U.S.C. 154(b) by 0 days.

(21) Appl. No.: 16/507,264

(22) Filed: Jul. 10, 2019

(65) Prior Publication Data

US 2021/0103377 A1 Apr. 8, 2021

Related U.S. Application Data

(60) Provisional application No. 62/695,852, filed on Jul. 10, 2018.

(51) Int. Cl.
G06F 3/041 (2006.01)
G06F 3/046 (2006.01)

(52) U.S. Cl.
CPC .......... *G06F 3/04186* (2019.05); *G06F 3/046* (2013.01)

(58) Field of Classification Search
CPC .............................. G06F 3/04186; G06F 3/046
See application file for complete search history.

(56) References Cited

U.S. PATENT DOCUMENTS

| | | | |
|---|---|---|---|
| 2012/0044119 A1 | 2/2012 | Libonati et al. | |
| 2012/0194393 A1* | 8/2012 | Uttermann | H01Q 1/243 343/702 |
| 2012/0287078 A1* | 11/2012 | Lin | G06F 3/0446 345/174 |
| 2014/0071008 A1* | 3/2014 | Desclos | H01Q 5/378 343/745 |
| 2015/0022403 A1* | 1/2015 | Lin | H01Q 1/243 343/702 |
| 2015/0145810 A1* | 5/2015 | Shih | G06F 3/04166 345/174 |

(Continued)

FOREIGN PATENT DOCUMENTS

| | | |
|---|---|---|
| CN | 104123006 A | 10/2014 |
| TW | I545430 B | 8/2016 |

*Primary Examiner* — Albert K Wong
(74) *Attorney, Agent, or Firm* — Rosenberg, Klein & Lee (57) ABSTRACT

The present invention relates to a proximity sensor and a proximity sensing method. The proximity sensor includes a sensing element and a sensing circuit. The sensing circuit is coupled to the sensing element and transmits a first driving signal and a second signal to the sensing element, respectively. The sensing element receives the first driving signal and the second driving signal, respectively, and generates a first sensing signal and a second sensing signal, respectively. The sensing circuit generates a proximity signal according to the first sensing signal and the second sensing signal. Therefore, the present invention may improve the accuracy of sensing the proximity of the human body whether near to the sensor. In addition, the sensing circuit is further coupled to a radio-frequency circuit, and the sensing circuit transmits a driving signal or/and receives a sensing signal according to the state of the radio-frequency circuit, thereby reducing interference of the sensing circuit to the radio-frequency circuit.

18 Claims, 12 Drawing Sheets

(56) References Cited

U.S. PATENT DOCUMENTS

| | | | |
|---|---|---|---|
| 2015/0200447 A1* | 7/2015 | Tang | H01Q 1/243 |
| | | | 343/720 |
| 2016/0061983 A1* | 3/2016 | Heikura | H01Q 1/243 |
| | | | 324/207.15 |
| 2016/0065260 A1* | 3/2016 | Heikura | H04B 1/3838 |
| | | | 455/575.5 |
| 2016/0124574 A1* | 5/2016 | Rouaissia | G06F 3/044 |
| | | | 345/174 |
| 2016/0209942 A1* | 7/2016 | Yang | G06F 3/0412 |
| 2017/0033830 A1* | 2/2017 | Ramachandran | H04B 1/44 |
| 2017/0090599 A1* | 3/2017 | Kuboyama | G06F 3/03547 |
| 2017/0235386 A1* | 8/2017 | Almholt | H03K 17/955 |
| | | | 345/174 |
| 2018/0076256 A1* | 3/2018 | Jiang | H01L 27/14678 |
| 2018/0096660 A1* | 4/2018 | Liu | G09G 3/3607 |
| 2018/0128650 A1* | 5/2018 | Bruwer | G01D 5/2006 |
| 2018/0212313 A1* | 7/2018 | Harper | H01Q 5/321 |
| 2018/0294549 A1* | 10/2018 | Tang | H01Q 5/328 |
| 2018/0331706 A1* | 11/2018 | Nys | H03K 17/955 |
| 2018/0335873 A1 | 11/2018 | Elias et al. | |
| 2019/0115649 A1* | 4/2019 | Zhao | H04B 1/1027 |
| 2020/0145931 A1* | 5/2020 | Lin | H04W 52/28 |
| 2020/0166376 A1* | 5/2020 | Bruwer | G01D 5/2046 |
| 2021/0075085 A1* | 3/2021 | Chang | H01Q 1/245 |
| 2021/0127000 A1* | 4/2021 | Kim | G06F 1/1684 |

* cited by examiner

PROXIMITY SENSOR AND PROXIMITY SENSING METHOD

FIELD OF THE INVENTION

The present invention relates generally to a sensor, and particularly to a proximity sensor and a proximity sensing method.

BACKGROUND OF THE INVENTION

Many of modern electronic devices include proximity sensors, for example, mobile phones, for sensing if a human body is proximate and then shutting off some functions such as the display. Currently, in the field, standalone capacitive sensors are adopted for detecting human proximity. They can be further used as sensors for reducing specific absorptivity. In addition, antennas are also used for detecting proximity of human body. Unfortunately, since the sensors according to the prior adopt a single piece of sensing information as reference for judging if a human body is proximate, false detection might easily occur. Sensors are vulnerable to the interference by water, humidity, or other environmental noises. Hence, totally relying on a single piece of sensing information might lead false judgement and thus influencing the performance of electronic devices. For example, the radio-frequency power might be lowered at the moment when not required. Besides, the sensing operations of proximity sensors can interfere the operations of the communication module of electronic devices easily. Consequently, the communication performance of electronic devices will be influenced.

Given the above problems, the present invention provides a proximity sensor and a proximity sensing method for improving the accuracy of sensing human proximity. In addition, the interference of the operations of a proximity sensor on the communication module can be reduced and this increasing the performance of electronic devices.

SUMMARY

An objective of the present invention is to provide a proximity sensor and a proximity sensing method, which uses two different sensing signals to judge proximity of a human body to the sensor and hence enhancing sensing accuracy.

Another objective of the present invention is to provide a proximity sensor and a proximity sensing method, which transmits a driving signal or receives a sensing signal according to the corresponding the state of the communication module and hence reducing the interference on the communication module by the operations of the sensor.

The present invention discloses a proximity sensor, which comprises a sensing element and a sensing circuit. The sensing element receives a first driving signal and a second driving signal, respectively, for generating a first sensing signal and a second sensing signal, respectively. The sensing circuit is coupled to the sensing element, transmits the first driving signal and the second driving signal to the sensing element, and generates a proximity signal according to the first sensing signal and the second sensing signal.

The present invention further discloses a proximity sensing method, which comprises executing a self-inductance sensing mode and a mutual-inductance mode for generating a self-inductance sensing signal and a mutual-inductance sensing signal, respectively; and generating a proximity signal according to the self-inductance sensing signal and the mutual-inductance sensing signal.

The present invention further discloses a proximity sensor, which comprises a sensing element and a sensing circuit. The sensing circuit is coupled to the sensing element and transmits one or more driving signal to the sensing element. The sensing element receives the one or more driving signal and generates one or more sensing signal. The sensing circuit generates a proximity signal according to the one or more sensing signal. The sensing circuit is further coupled to an RF circuit and transmits the one or more driving signal or/and receives the one or more sensing signal corresponding to the state of the RF circuit.

DETAILED DESCRIPTION

In the specifications and subsequent claims, certain words are used for representing specific devices. A person having ordinary skill in the art should know that hardware manufacturers might use different nouns to call the same device. In the specifications and subsequent claims, the differences in names are not used for distinguishing devices. Instead, the differences in the devices on the whole technique are the guidelines for distinguishing. In the whole specifications and subsequent claims, the word "comprising" is an open language and should be explained as "comprising but not limited to". Besides, the word "couple" includes any direct and indirect connection means. Thereby, if the description is that a first device is coupled to a second device, it means that the first device is connected to the second device directly, or the first device is connected to the second device via other device or connecting means indirectly.

Figure 1:
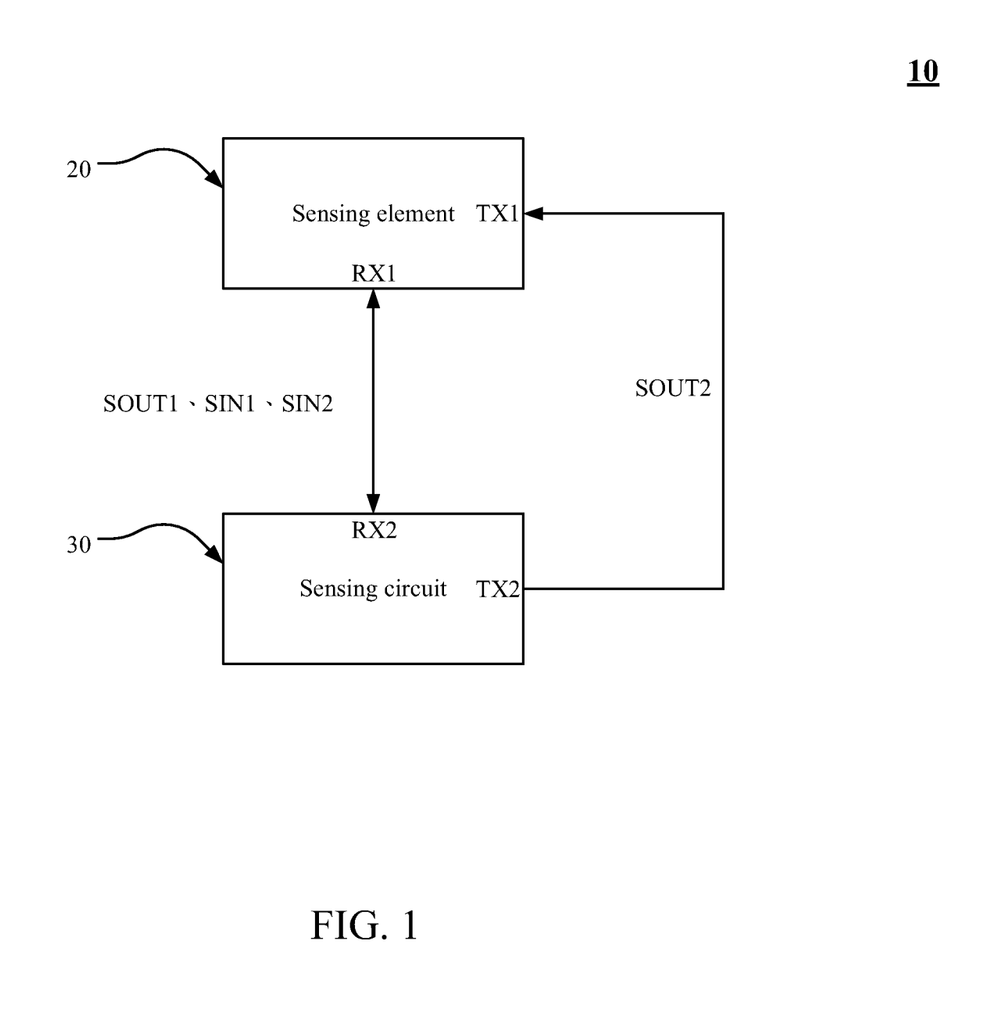
FIG. 1 shows a schematic diagram of the proximity sensor according to the first embodiment of the present invention.

Please refer to FIG. 1, which shows a schematic diagram of the proximity sensor according to the first embodiment of the present invention. As shown in the figure, the proximity sensor 10 according to the present invention comprises a sensing element 20 and a sensing circuit 30. The proximity sensor 10 can be disposed in a mobile device, which is also called a handheld device, including a smartphone, a tablet computer, or a smart watch. The mobile device can include a display panel, a battery, a housing, various driving chips, and/or various sensing chips. In the figure according to the embodiment, the above components are not illustrated.

The sensing element 20 includes a first signal terminal RX1 and a second signal terminal TX1. The sensing circuit 30 is coupled to the first signal terminal RX1 and the second signal terminal TX1 of the sensing element 20. Besides, the sensing circuit 30 includes a first transmission terminal RX2 and a second transmission terminal TX2. The sensing circuit 30 outputs a first driving signal SOUT1 to the first signal terminal RX1 of the sensing element 20. The sensing element 20 generates a first sensing signal SIN1 corresponding to the first driving signal SOUT1. The sensing signal SIN1 will vary once a human body uses or is proximate to the mobile device (the proximity sensor 10), namely the sensing element 20 can sense if the human body is proximate to the mobile device (the proximity sensor 10). The first sensing signal SIN1 is transmitted to the sensing circuit 30 via the first signal terminal RX1 and the first transmission terminal RX2. The sensing circuit 30 can generate a proximity signal according to the first sensing signal SIN1. The proximity signal represents if the human body is proximate to the proximity sensor 10, meaning if the human body is proximate to the mobile device. According to an embodiment of the present invention, the proximity signal can be transmitted to a host, which can be the controller or microcontroller of the mobile device. The host can know if the human body is proximate to the mobile device according to the proximity signal. If so, the host can execute the corresponding events, such as controlling the communication module to lower the RF power. In addition, according to another embodiment of the present invention, the proximity signal can be transmitted to the communication module, which can determine whether to lower the RF power according to the proximity signal directly.

Moreover, when a liquid, such as water, or humidity contacts the mobile device, namely, approaching to the proximity sensor 10, the first sensing signal SIN1 generated by the sensing element 20 might not differentiate the contact on the mobile device by the human body, liquid, and humidity. Thereby, the sensing circuit 30 can output a second driving signal SOUT2 via the second transmission terminal TX2 to the second signal terminal TX1 of the sensing element 20. The sensing element 20 generates a second sensing signal SIN2 corresponding to the second driving signal SOUT2. The second sensing signal SIN2 will vary when the human body uses or is proximate to the mobile device. The second sensing signal SIN2 is transmitted to the sensing circuit 30 via the first signal terminal RX1 and the first transmission terminal RX2. Hence, the sensing circuit 30 receives the first sensing signal SIN1 and the second sensing signal SIN2, and generates the proximity signal according to the first sensing signal SIN1 and the second sensing signal SIN2. Then the sensing circuit 30 can identify it is the human body, liquid, or humidity that is proximate to the mobile device and thus concretely sensing if the human body is proximate to the mobile device.

Thereby, the sensing circuit 30 transmits the first driving signal SOUT1 and the second driving signal SOUT2 to the sensing element 20, respectively. The first signal terminal RX1 and the second signal terminal TX1 of the sensing element 20 are coupled to the first transmission terminal RX2 and the second transmission terminal TX2 of the sensing circuit 30, respectively, receive the first driving signal SOUT1 and the second driving signal SOUT2, respectively, and generate the first sensing signal SIN1 and the second sensing signal SIN2, respectively. The sensing circuit 30 receives the first sensing signal SIN1 and the second sensing signal SIN2 via the first signal terminal RX1 and generates the proximity signal according to the first sensing signal SIN1 and the second sensing signal SIN2. The first signal terminal RX1 and the second signal terminal TX1 are different signal terminals.

Figure 2:
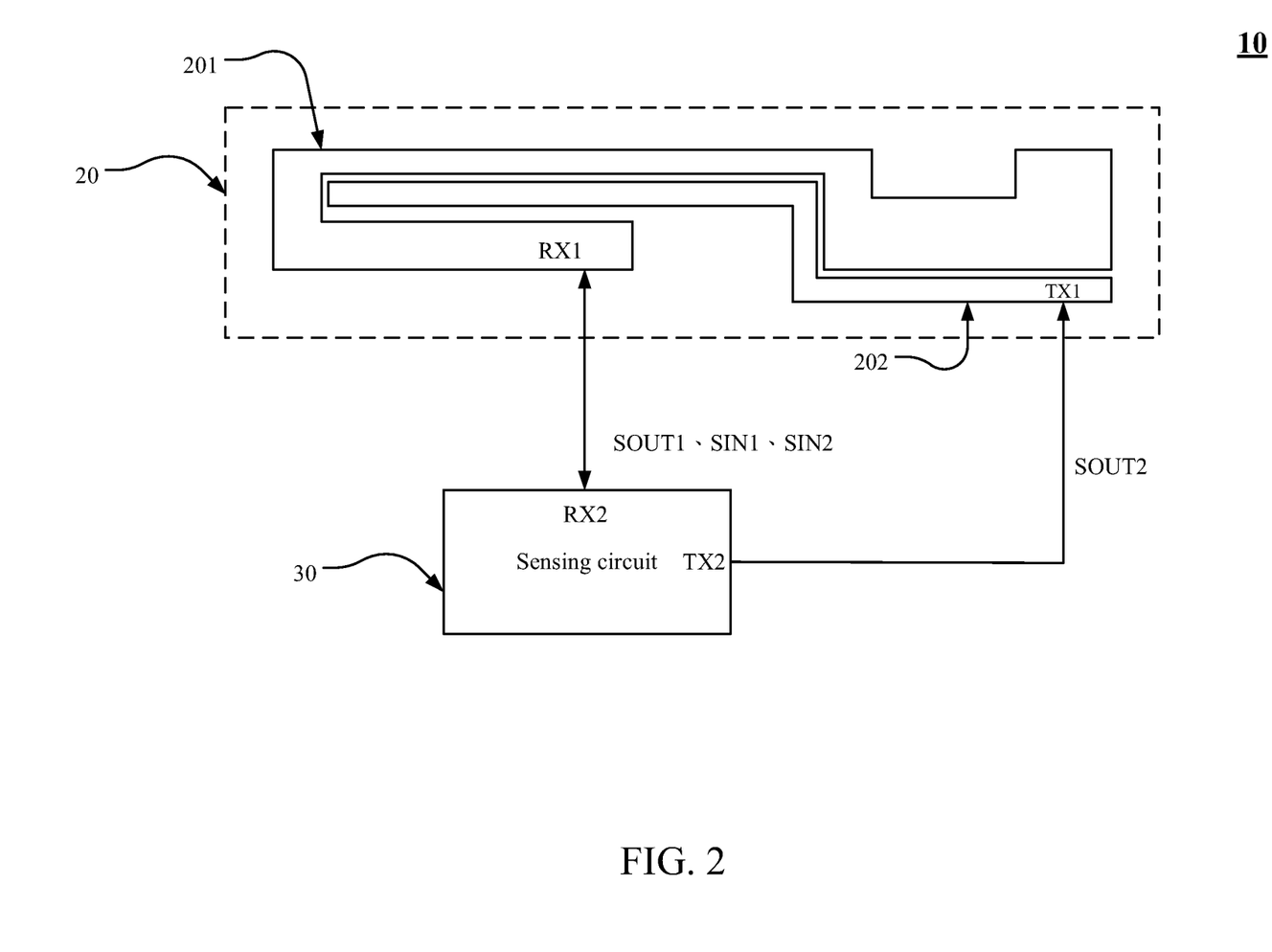
FIG. 2 shows a structure diagram of the sensing element in the proximity sensor according to an embodiment of the present invention.

Please refer to FIG. 2, which shows a structure diagram of the sensing element in the proximity sensor according to an embodiment of the present invention. As shown in the figure, the sensing element 20 includes a first sensing part 201 and a second sensing part 202, which can be a conductive structure such as a metal. Their shape, size, and location can be modified according to demand and are not limited by the present invention. The first signal terminal RX1 of the first sensing part 201 is coupled to the first transmission terminal RX2 of the sensing circuit 30. The sensing circuit 30 transmits the first driving signal SOUT1 to the first signal terminal RX1 of the first sensing part 201. The first sensing part 201 generates the first sensing signal SIN corresponding to the first driving signal SOUT1 by self-inductance. The second signal terminal TX1 of the second sensing part 202 is coupled to the second transmission terminal TX2 of the sensing circuit 20 and adjacent to the first sensing part 201 with a gap. The sensing circuit 20 transmits the second driving signal SOUT2 to the second signal terminal TX1 of the second sensing part 202. The first sensing part 201 generates the second sensing signal SIN2 corresponding to the second driving signal SOUT2 transmitted to the second sensing part 202 by mutual-inductance.

By using the first sensing part 201 and the second sensing part 202, the proximity sensor 10 can execute two sensing methods including the self-inductance sensing mode and the mutual-inductance sensing mode. Thereby, the first driving signal SOUT1 and the first sensing signal SIN1 are a self-inductance driving signal and a self-inductance sensing signal, respectively, in the self-inductance sensing mode; the second driving signal SOUT2 and the second sensing signal SIN2 are a mutual-inductance driving signal and a mutual-inductance sensing signal, respectively, in the mutual-inductance sensing mode. According to an embodiment of the present invention, the proximity sensor 10 executes the self-inductance sensing mode and the mutual-inductance sensing mode at different times. When a finger or water (humidity) is proximate to the proximity sensor 10, the first sensing signal SIN1 given in the self-inductance sensing mode by the proximity sensor 10 can be expressed as:

$$CRX=CRX1+CRX \text{ (finger)}$$

$$CRX=CRX1+CRX \text{ (water)}$$

In the self-inductance sensing mode, CRX is the value of the first sensing signal SIN1, which can represent the capacitance value. CRX is the value of the first sensing signal SIN1 when no object like the human body or water is proximate to the proximity sensor 10. It can also represent the capacitance value. CRX (finger) is the difference in the value of the first sensing signal SIN1 caused by the human body's proximity to the proximity sensor 10. It also represents the change in the capacitance value. CRX (water) is the difference in the value of the first sensing signal SIN1 when water is proximate to the proximity sensor 10. It also represents the change in the capacitance value. Thereby, when there is no finger of the human body or water is proximate to the proximity sensor 10, the value CRX of the first sensing signal SIN1 output by the first signal terminal RX1 of the first sensing part 201 is equal to CRX1. In addition, according to the above equations, because either the finger or water can cause the value CRX of the first sensing signal SIN1 to increase once approximate to the proximity sensor 10, it cannot be judged accurately which object is proximate to the proximity sensor 10.

When the finger or water (humidity) is proximate to the proximity sensor 10, the proximity sensor 10 executes the mutual-inductance sensing mode to give the second sensing signal SIN2, which can be expressed as:

$CTRX=CTRX1-CTRX$ (finger)

$CTRX=CTRX1+CTRX$ (water)

In the mutual-inductance sensing mode, CTRX is the value of the second sensing signal SIN2, which can represent the capacitance value. CTRX1 is the value of the second sensing signal SIN2 when no object like the human body or water is proximate to the proximity sensor 10. It can also represent the capacitance value. CTRX (finger) is the difference in the value of the second sensing signal SIN2 caused by the human body's proximity to the proximity sensor 10. It also represents the change in the capacitance value. CTRX (water) is the difference in the value of the second sensing signal SIN2 when water is proximate to the proximity sensor 10. It also represents the change in the capacitance value. The difference between the mutual-inductance sensing mode and the self-inductance sensing mode is that their sensing values for the human body have reversed polarities while their sensing values for the water are both positive. In the mutual-inductance sensing mode, since the physical properties of the water and human body are different, the values in the polarity of the second sensing signal SIN2 for the two will be reversed. Thereby, when the human body is proximate to or touch a mobile device, the value CTRX of the second sensing signal SIN2 will fall, while when the water is proximate to or contact the mobile device, the value CTRX of the second sensing signal SIN2 will rise. Accordingly, by comparing the values CRX of the first sensing signal SIN1 with the value CTRX of the second sensing signal SIN2 acquired in the self-inductance sensing mode and the mutual-inductance sensing mode, whether the human body or liquid (water) is proximate to or touches a mobile device can be judged. According to an embodiment of the present invention, the proximity signal can be transmitted to the host (not shown in the figure). The host can know if the human body is proximate to the mobile device according to the proximity signal. If so, the host can execute the corresponding event such as controlling the communication module to lower the RF power. In addition, according to another embodiment of the present invention, the proximity signal can be transmitted to the RF circuit 31, which can determine whether to reduce the RF power, namely, reduce the power of the RF signal, according to the proximity signal directly.

Figure 3:
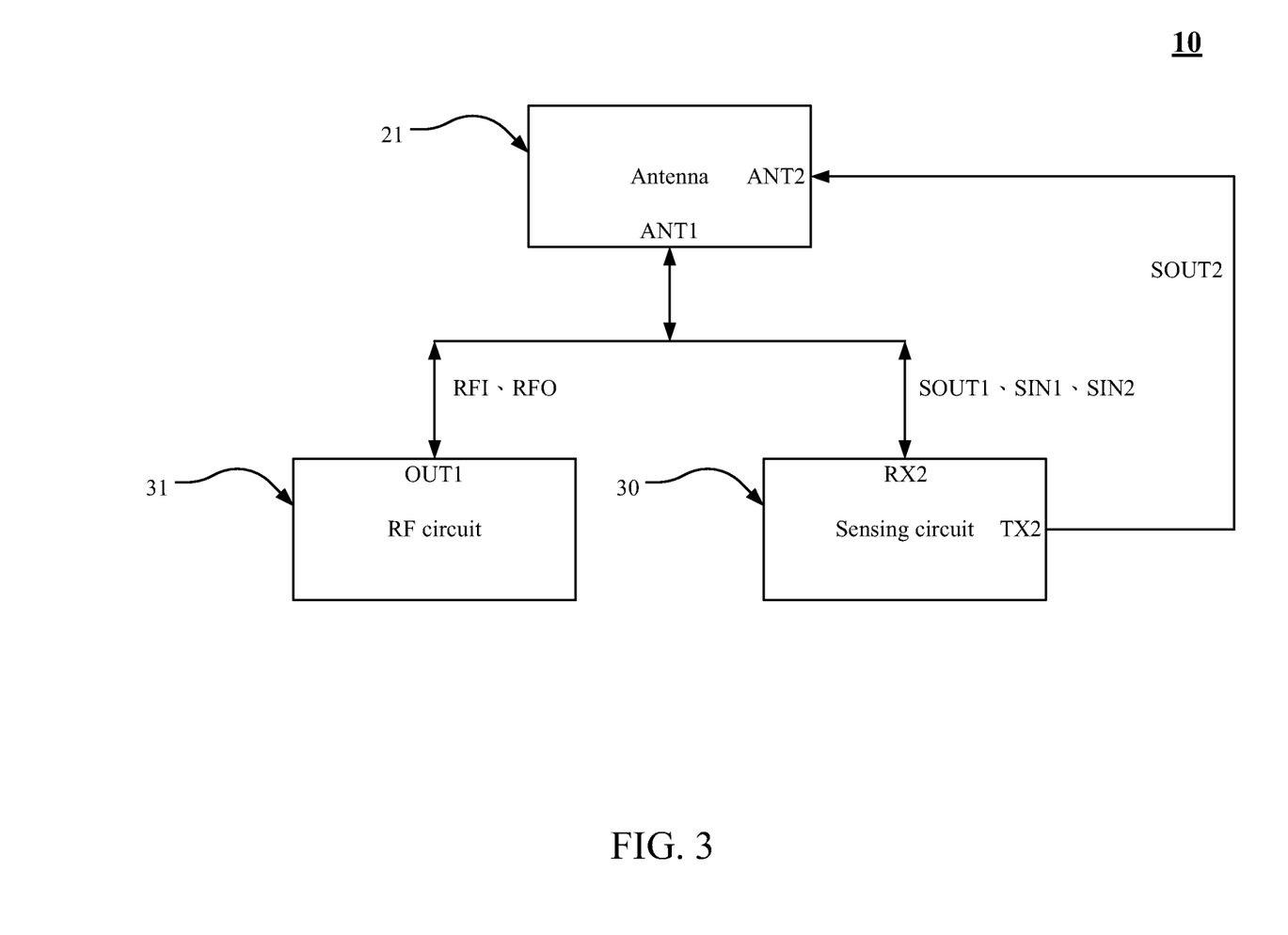
FIG. 3 shows a schematic diagram of the proximity sensor according to the second embodiment of the present invention.

Please refer to FIG. 3, which shows a schematic diagram of the proximity sensor according to the second embodiment of the present invention. As shown in the figures, the sensing element 20 according to the embodiment in FIG. 1 can be an antenna 21 according to the embodiment in FIG. 3. Thereby, the first sensing part 201 and the second sensing part 202 in FIG. 2 can be a first antenna part and a second antenna part, respectively. The antenna 21 includes the first antenna terminal ANT1 and the second antenna terminal ANT2, which are equivalent to the first signal terminal RX1 and the second signal terminal TX1 according to the above embodiment. In addition, the antenna 21 can be different from the structure shown in FIG. 2. It can include two different antennas to act as the first antenna part and the second antenna part, respectively. These two antennas can be network antennas, telecommunication antennas, or other communication antennas. The present invention is not limited to the type of antenna. The antenna 21 according to the present embodiment can be used for sensing proximity and is coupled to the sensing circuit 30 and the RF circuit 31 of a communication module. The first antenna terminal ANT1 of the antenna 21 is coupled to the first transmission terminal RX2 of the sensing circuit 30 and a first transmission terminal OUT1 of the RF circuit 31; the second antenna terminal ANT2 of the antenna 21 is coupled to the second transmission terminal TX2 of the sensing circuit 30. According to an embodiment of the present invention, the antenna 21 can further include a terminal (not shown in the figure) for coupled to the first transmission terminal OUT1 of the RF circuit 31.

Furthermore, in the self- or/and mutual-inductance sensing mode, the sensing circuit 30 executes the driving or/and receiving task, generates the self- and mutual-inductance sensing signals, respectively, and generating the proximity signal according to the self- and mutual-inductance sensing signals. Thereby, when the sensing circuit 30 executes the driving task, it transmits the first driving signal SOUT1 (the self-inductance driving signal) to the first antenna terminal ANT1 of the antenna 21 or the second driving signal SOUT2 (the mutual-inductance driving signal) to the second antenna terminal ANT2 of the antenna 21. When the sensing circuit 30 executes the receiving task, it receives the first sensing signal SIN1 (the self-inductance sensing signal) or the second sensing signal SIN2 (the mutual-inductance signal) from the first antenna terminal ANT1 of the antenna 21. In other words, when the sensing circuit 30 executes the self-inductance sensing mode, it transmits the self-inductance driving signal (the first driving signal SOUT1) to the sensing element 20 (or the antenna 21); the sensing element 20 generates the self-inductance sensing signal (the first sensing signal SIN1) corresponding to the self-inductance driving signal; and the sensing circuit 20 receives the self-inductance sensing signal. When the sensing circuit 30 executes the mutual-inductance sensing mode, it transmits the mutual-inductance driving signal (the second driving signal SOUT2) to the sensing element 20 (or the antenna 21); and the sensing element 20 generates the mutual-inductance sensing signal (the second sensing signal SIN2) corresponding to the mutual-inductance driving signal and receives the mutual-inductance sensing signal. Besides, the proximity sensor 10 can selectively executes the self-inductance sensing mode, the mutual-inductance sensing mode, or the two modes alternately, depending on the requirements.

Please refer again to FIG. 3. The RF circuit 31 can be in a transmitting state or a receiving state. When the RF circuit 31 is the transmitting state, it transmits an RF signal RFO to the antenna 21. When the RF circuit 31 is in the receiving state, it receives a wireless signal REI from the antenna 21. In addition, according to the embodiment in FIG. 3, the proximity sensor 10 shares the antenna 21 of the communication module. Thereby, the communication module can include the antenna 21 and the RF circuit 31. The RF circuit 31 is coupled to the antenna 21. When the communication module is in the transmitting state, the RF circuit 31 transmits the RF signal RFO to the antenna 21. When the communication module is in the receiving state, the RF circuit 31 receives the wireless signal RF1 received by the antenna 21.

Figure 4:
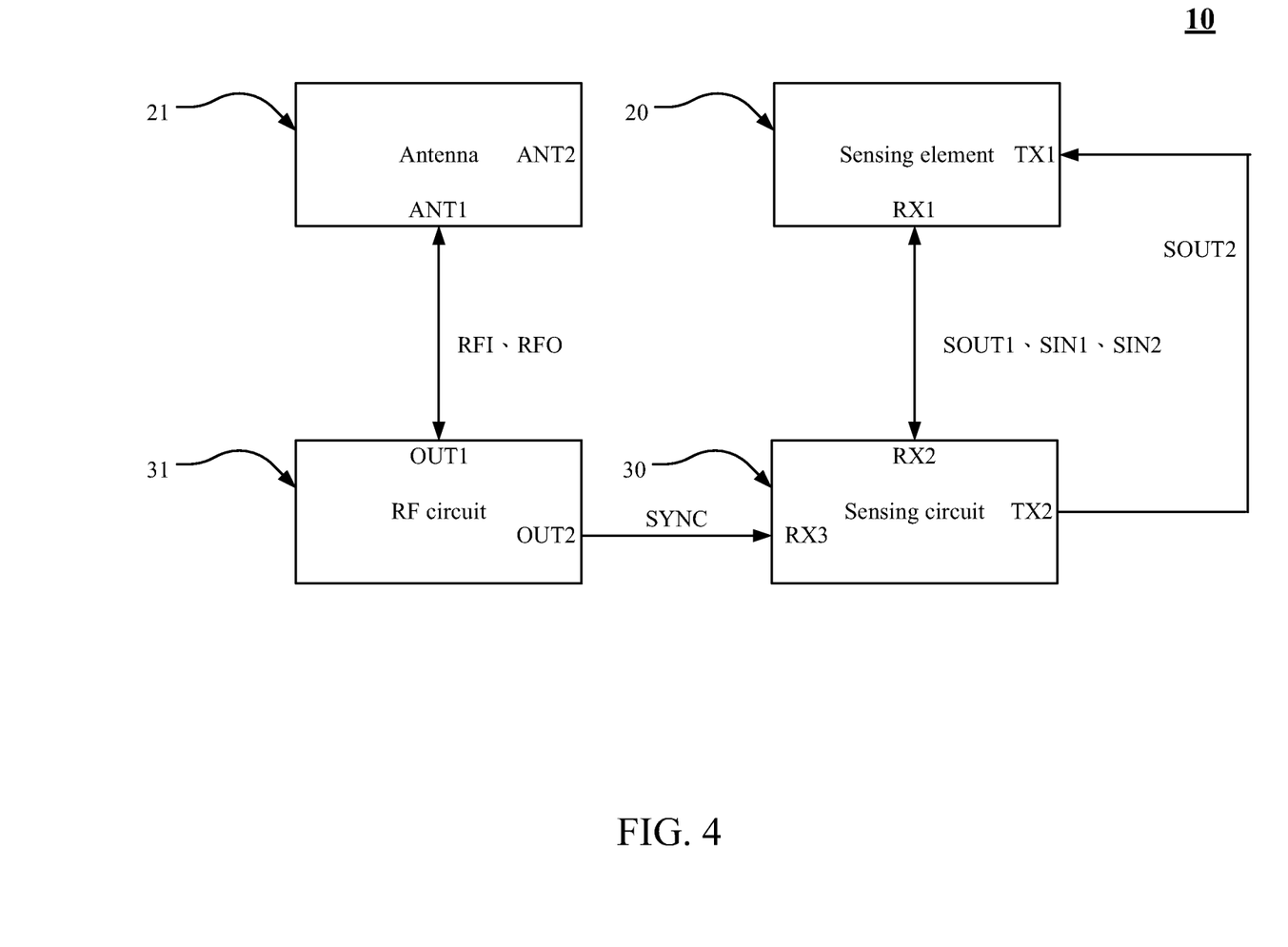
FIG. 4 shows a schematic diagram of the proximity sensor according to the third embodiment of the present invention.

Please refer to FIG. 4, which shows a schematic diagram of the proximity sensor according to the third embodiment of the present invention. As shown in the figure, the proximity sensor 10 can comprise the sensing element 20, the sensing circuit 30, and the communication module. The communication module includes the antenna 21 and the RF circuit 31. Alternatively, the sensing circuit 30 of the proximity sensor 10 is connected to the communication module outside the proximity sensor 10. The operations of the sensing element 20 and the sensing circuit 30 are illustrated in the description for the embodiments of FIG. 1 and FIG. 2; the operations of the antenna 21 and the RF circuit 31 are illustrated in the description for the embodiment in FIG. 3. Hence, the details will not be repeated here. The difference between the embodiment in FIG. 4 and the previous embodiments is that the RF circuit 31 according to the embodiment in FIG. 4 further includes a second transmission terminal OUT2 and the sensing circuit 30 further includes a third transmission terminal RX3. The second transmission terminal OUT2 of the RF circuit 31 is coupled to the third transmission terminal RX3 of the sensing circuit 30. A synchronization signal SYNC is transmitted between the sensing circuit 30 and the RF circuit 31. According to the present embodiment, the RF circuit 31 generates the synchronization signal SYNC, which is transmitted to the sensing circuit 30 through the second transmission terminal OUT2 and the third transmission terminal RX3. The sensing circuit 30 executes the driving task or/and the receiving task according to the synchronization signal SYNC. According to an embodiment of the present invention, the sensing circuit 30 generates the synchronization signal SYNC and transmits the synchronization signal SYNC to the RF circuit 31 through the third transmission terminal RX3 and the second transmission terminal OUT2. Since the single antenna 21 is shared, the sensing circuit 30 executes the driving task or/and the receiving task correspond to the state of the communication module (RF circuit 31).

The synchronization signal SYNC as described above can represent the current state, either the transmitting state or the receiving state, of the RF circuit 31. Thereby, the sensing circuit 30 can execute the driving task or/and the receiving task according to the synchronization signal SYNC. In other words, the sensing circuit 30 executes the driving task or/and the receiving task corresponding to the state of the RF circuit 31 and thus reducing the interference of the transmitted driving signal or the received sensing signal by the sensing circuit 30 on the transmitted RF signal or the received wireless signal by the RF circuit 31. According to another embodiment of the present invention, the synchronization signal SYNC can be generated by the sensing circuit 30. According to the synchronization signal SYNC, the RF circuit 31 can enter the transmitting state or the receiving state. Thereby, the RF circuit 31 can enter the transmitting state or the receiving state for matching the execution of the driving task or/and the receiving state by the sensing circuit 30.

Figure 5:
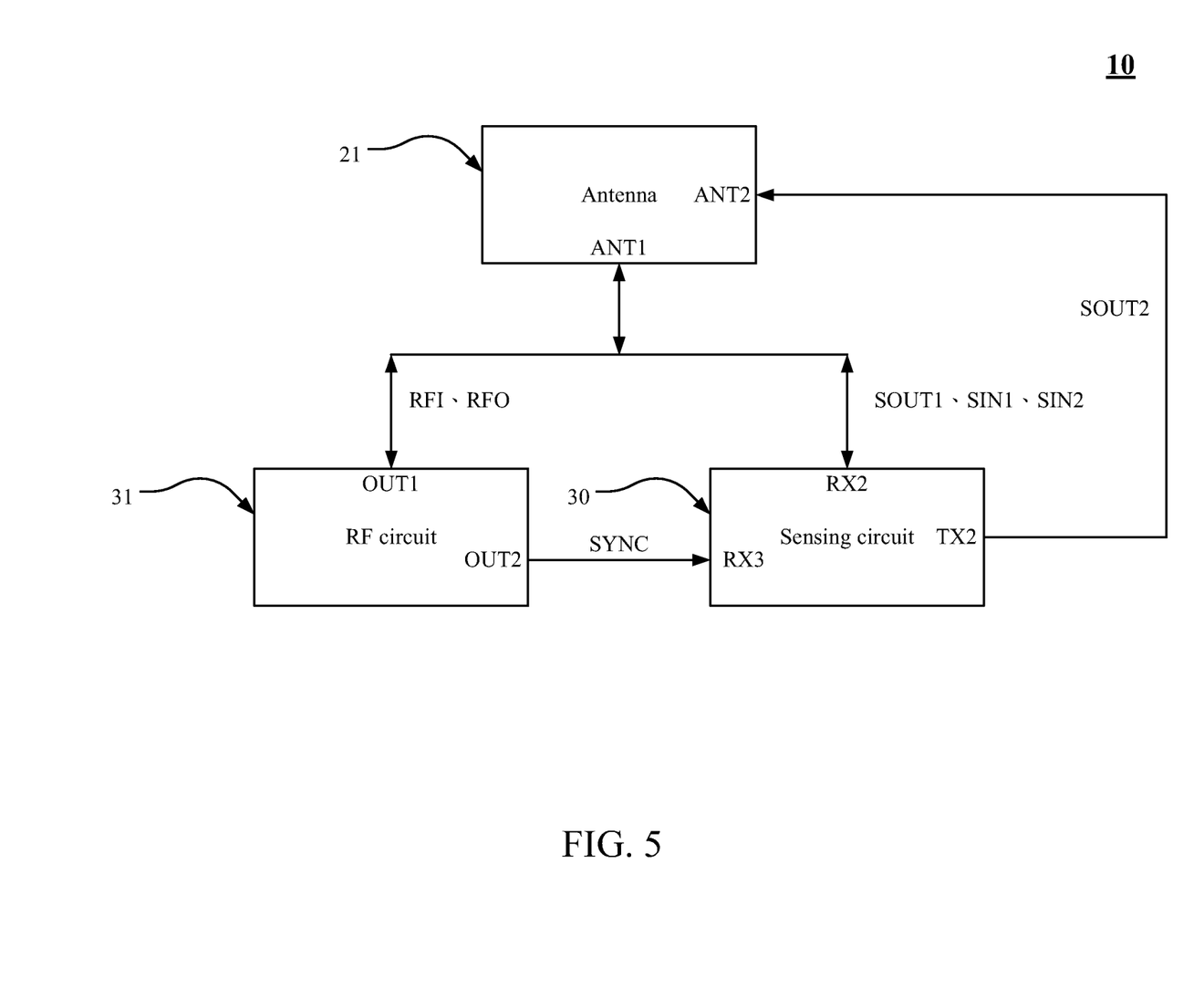
FIG. 5 shows a schematic diagram of the proximity sensor according to the fourth embodiment of the present invention.
Figure 6:
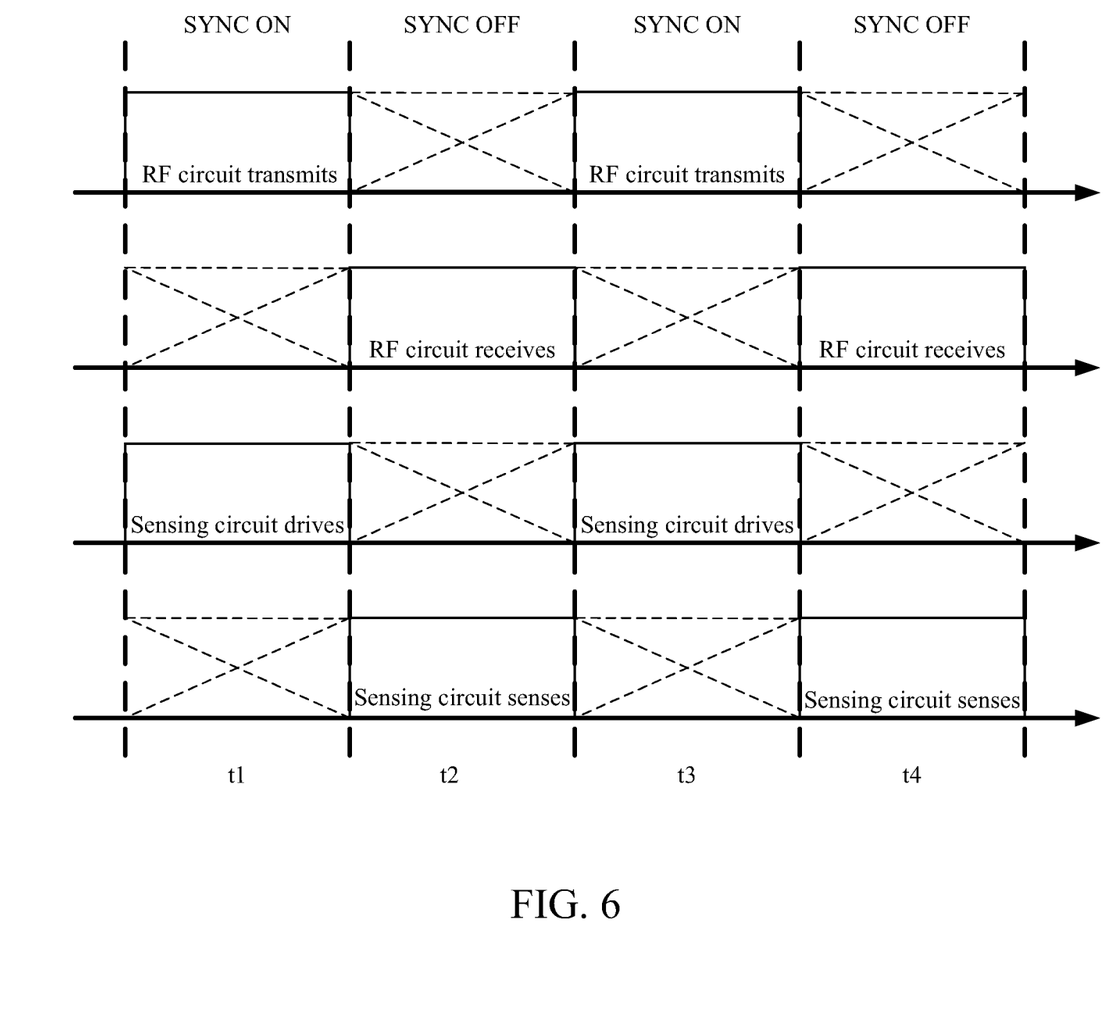
FIG. 6 shows a timing diagram of the operations of the sensing circuit and the RF circuit according to the first embodiment of the present invention.

Please refer to FIG. 5, which shows a schematic diagram of the proximity sensor according to the fourth embodiment of the present invention. As shown in the figure, by sharing the antenna 21, the synchronization signal SYNC still can be transmitted between the RF circuit 31 and the sensing circuit 30 for driving the sensing circuit 30 to execute the driving task or/the receiving task according to the synchronization signal SYNC. Besides, there are many variations in the operations of the sensing circuit 30 and the RF circuit 31 according to the synchronization signal SYNC. For example, as shown in FIG. 6, the synchronization signal SYNC includes a first level (SYNC ON) and a second level (SYNC OFF). The first level and the second level can be a high level and a low level, respectively, or the reversed. According to the embodiment in FIG. 6, at time t1 and time t3, the level of the synchronization signal is the first level, meaning that the RF circuit 31 is in the transmitting state and the sensing circuit 30 executes the driving task. At time t2 and time t4, the synchronization signal SYNC is the second level, meaning that the RF circuit 31 is in the receiving state and the sensing circuit 30 executes the receiving task. In other words, when the RF circuit 31 transmits the RF signal, the sensing circuit 30 also transmits the driving signal; when the RF circuit 31 receives the wireless signal, the sensing circuit 30, likewise, receives the sensing signal. Thereby, the interference of the operations of the sensing circuit 30 on the operations of the RF circuit 31 can be reduced.

Figure 7:
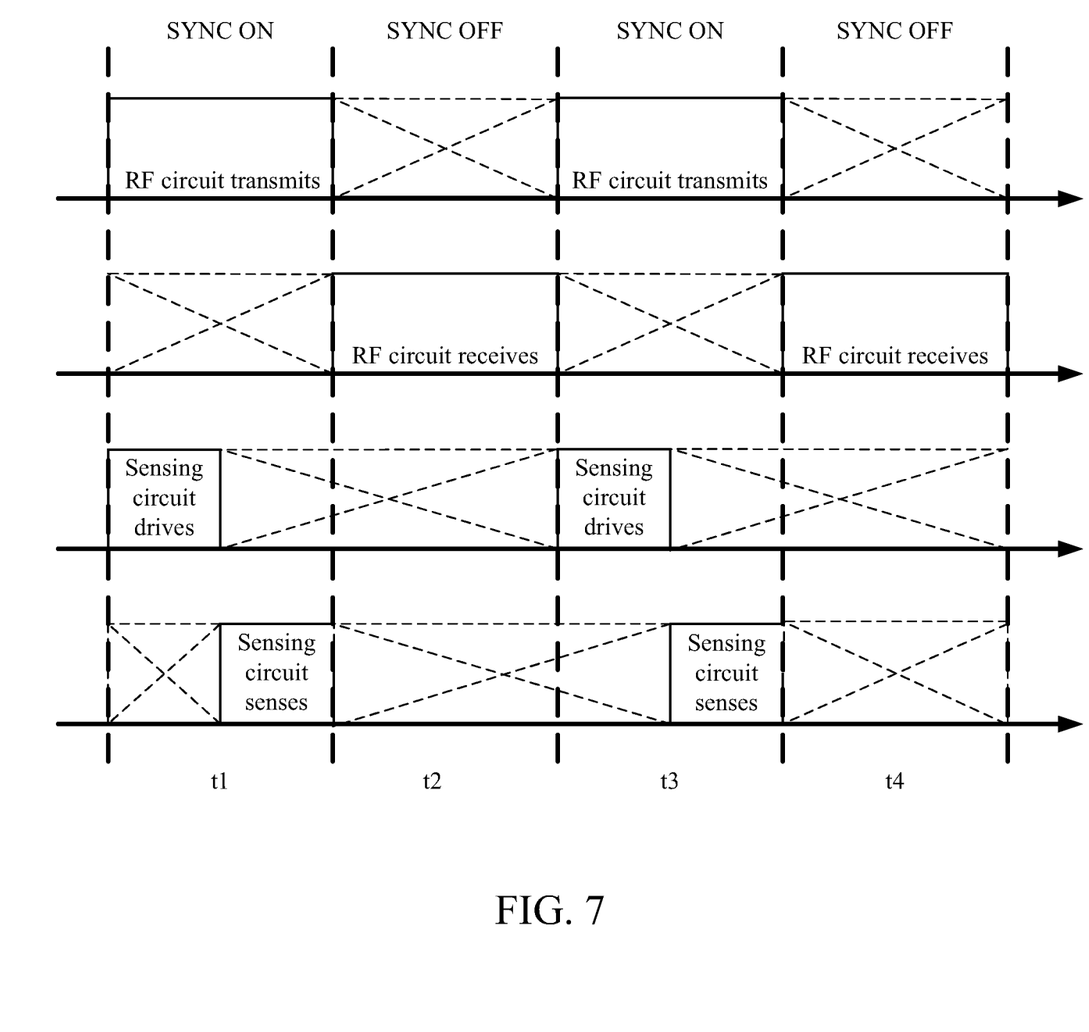
FIG. 7 shows a timing diagram of the operations of the sensing circuit and the RF circuit according to the second embodiment of the present invention.

Please refer to FIG. 7, which shows a timing diagram of the operations of the sensing circuit and the RF circuit according to the second embodiment of the present invention. As shown in the figure, at time t1 and t3, the level of the synchronization signal is the first level (SYNC ON), meaning that the RF circuit 31 is in the transmitting state and the sensing circuit 30 executes the driving task and the receiving task. At time t2 and t4, the level of the synchronization signal SYNC is the second level (SYNC OFF), meaning that the RF circuit 31 is in the receiving state and the sensing circuit 30 executes nothing.

Figure 8:
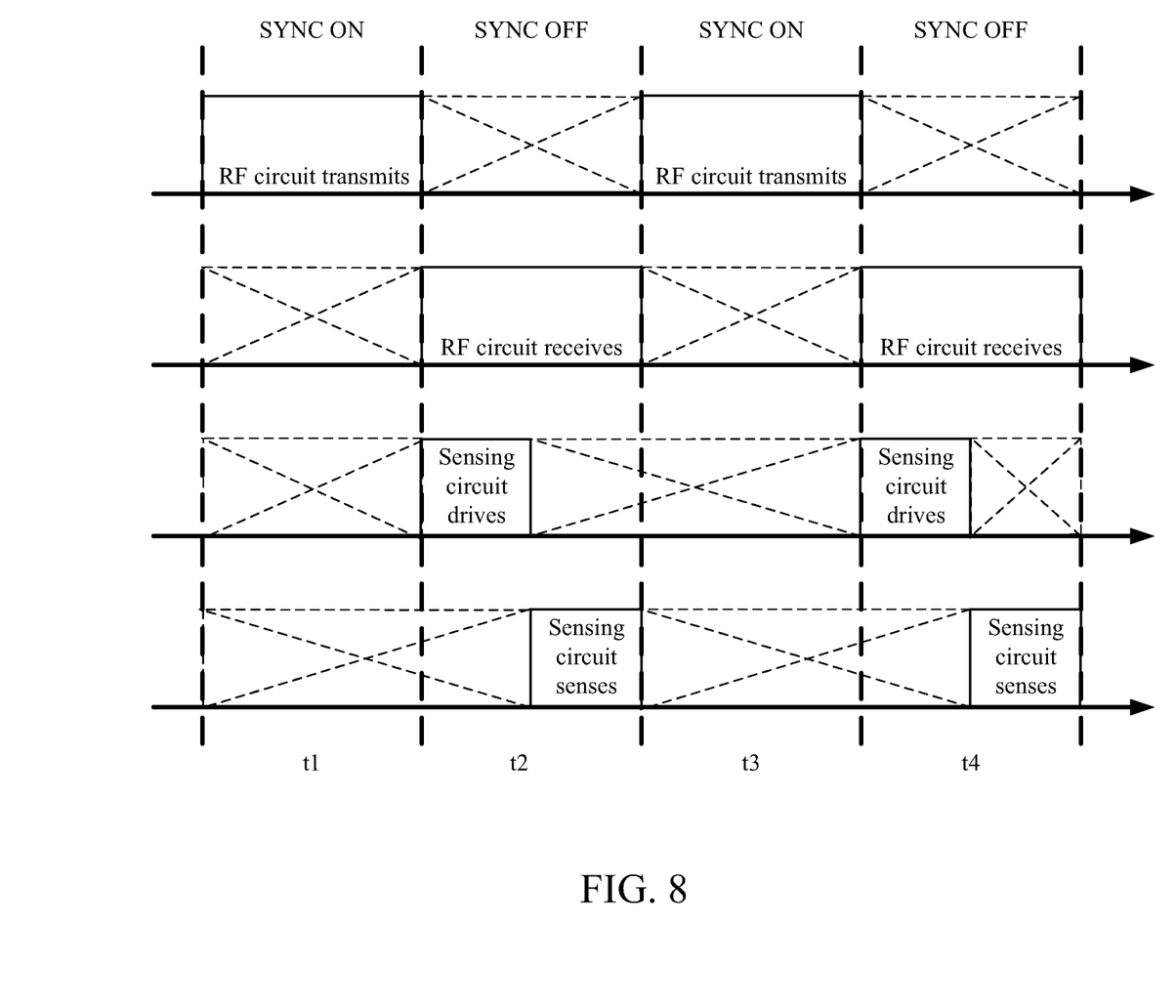
FIG. 8 shows a timing diagram of the operations of the sensing circuit and the RF circuit according to the third embodiment of the present invention.

Please refer to FIG. 8, which shows a timing diagram of the operations of the sensing circuit and the RF circuit according to the third embodiment of the present invention. As shown in the figure, the difference between the embodiment in FIG. 8 and the one in FIG. 7 is that according to the embodiment in FIG. 8, the RF circuit 31 is in the transmitting state and the sensing circuit 30 executes nothing. When the RF circuit 31 is in the receiving state, the sensing circuit 30 executes the driving task and the receiving task.

Figure 9:
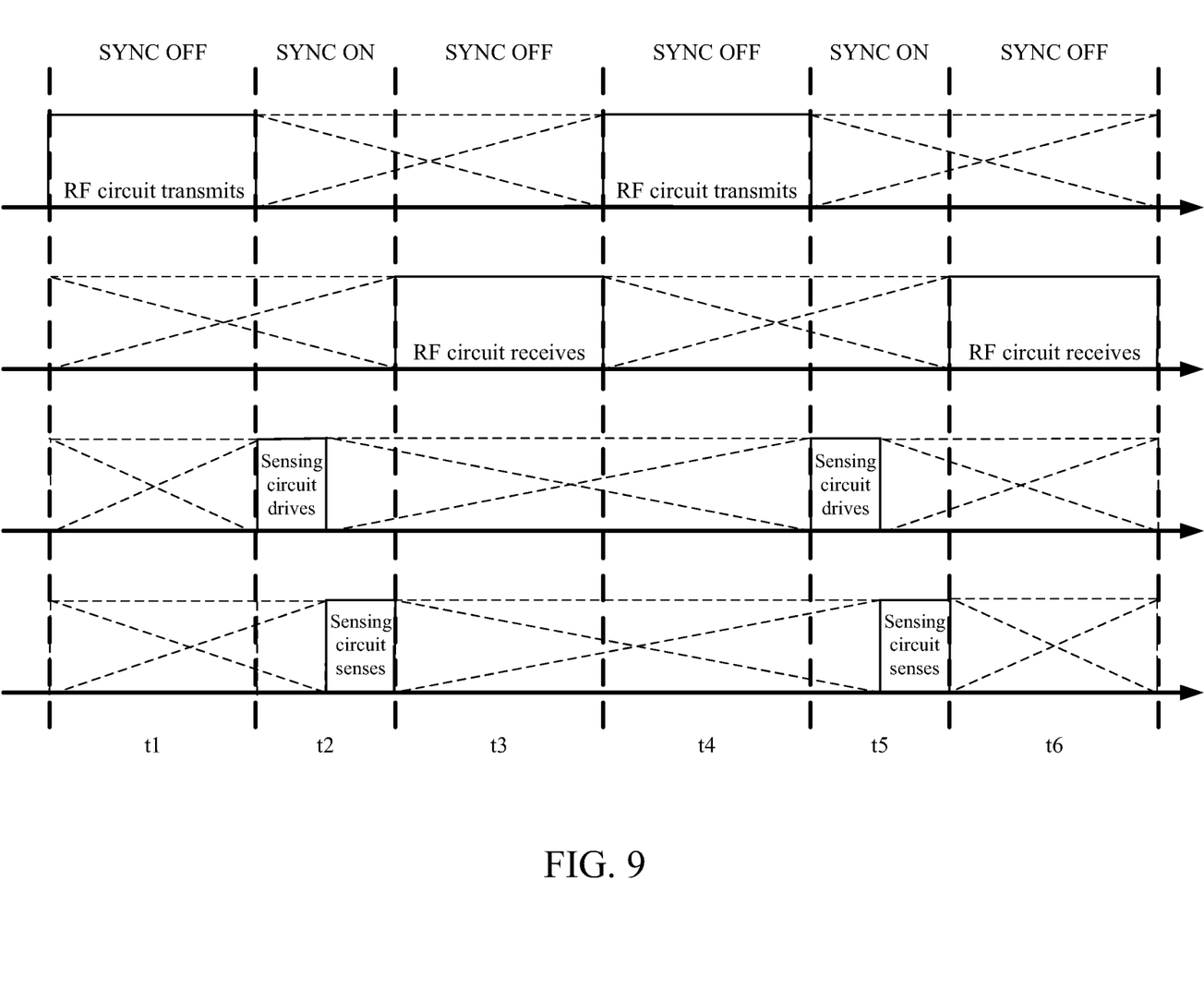
FIG. 9 shows a timing diagram of the operations of the sensing circuit and the RF circuit according to the fourth embodiment of the present invention.

Please refer to FIG. 9, which shows a timing diagram of the operations of the sensing circuit and the RF circuit according to the fourth embodiment of the present invention. As shown in the figure, after the RF circuit 31 transmits the transmitting signal, it will be in an idle state before it receives the wireless signal. According to the present embodiment, the level of the synchronization signal SYNC is the second level (SYNC OFF), meaning that the RF circuit 31 is in the transmitting state or the receiving state. When the level of the synchronization signal SYNC is the first level (SYNC ON), it means that the RF circuit 31 is in the idle state. The sensing circuit 30 can executes the driving task and the receiving task when the RF circuit 31 is in the idle state according to the synchronization signal SYNC.

Figure 10:
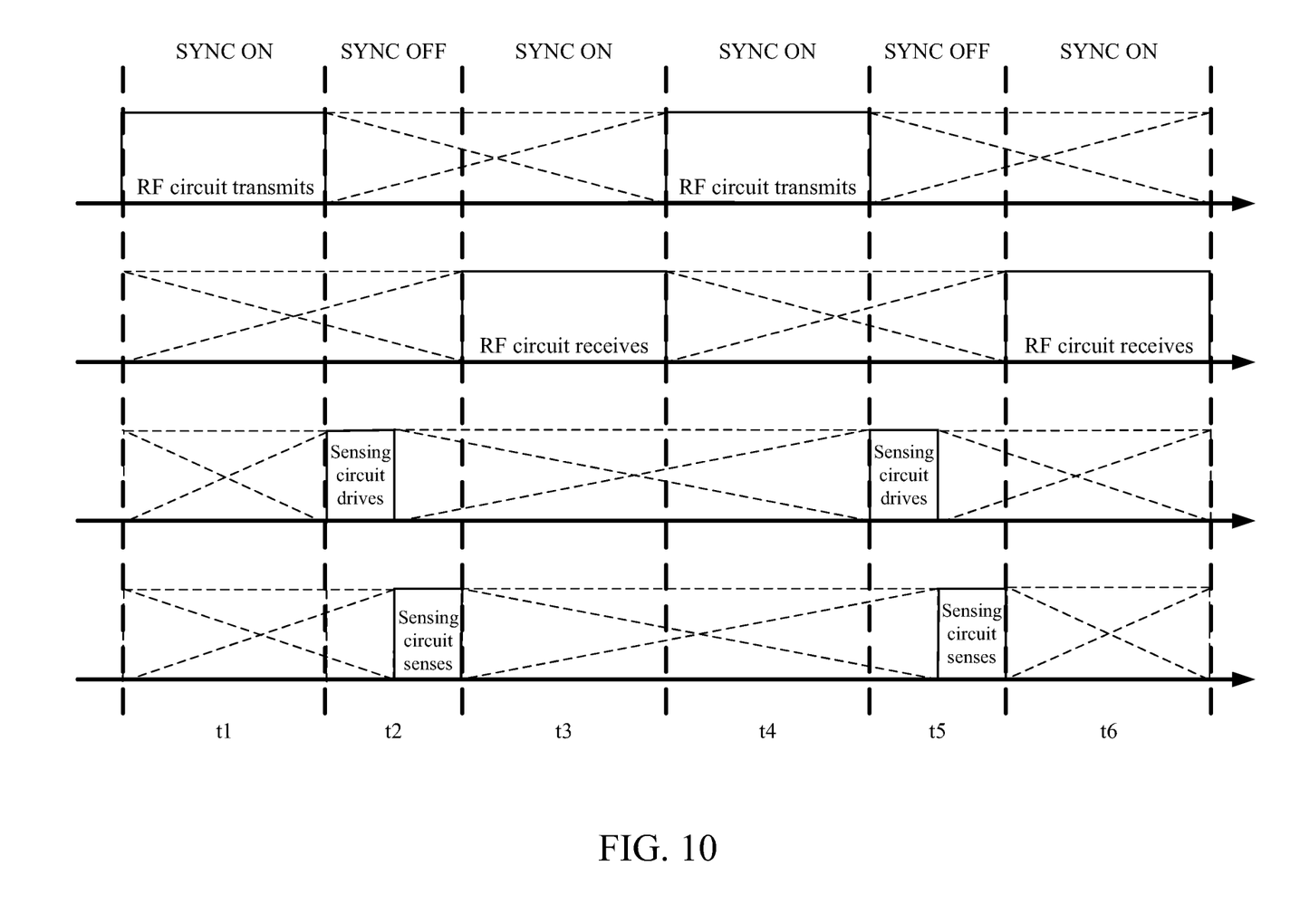
FIG. 10 shows a timing diagram of the operations of the sensing circuit and the RF circuit according to the fifth embodiment of the present invention.

Please refer to FIG. 10, which shows a timing diagram of the operations of the sensing circuit and the RF circuit according to the fifth embodiment of the present invention. As shown in the figure, the embodiment in FIG. 10 is similar to the embodiment in FIG. 9. The difference is that the level of the synchronization signal SYNC according to the embodiment in FIG. 10 is the first level (SYNC ON), meaning that the RF circuit 31 is in the transmitting state or the receiving state. When the level of the synchronization signal SYNC is the second level (SYNC OFF), it means the RF circuit 31 is in the idle state. The sensing circuit 30 can execute the driving task and the receiving task only when the level of the synchronization signal SYNC is the second level.

Figure 11:
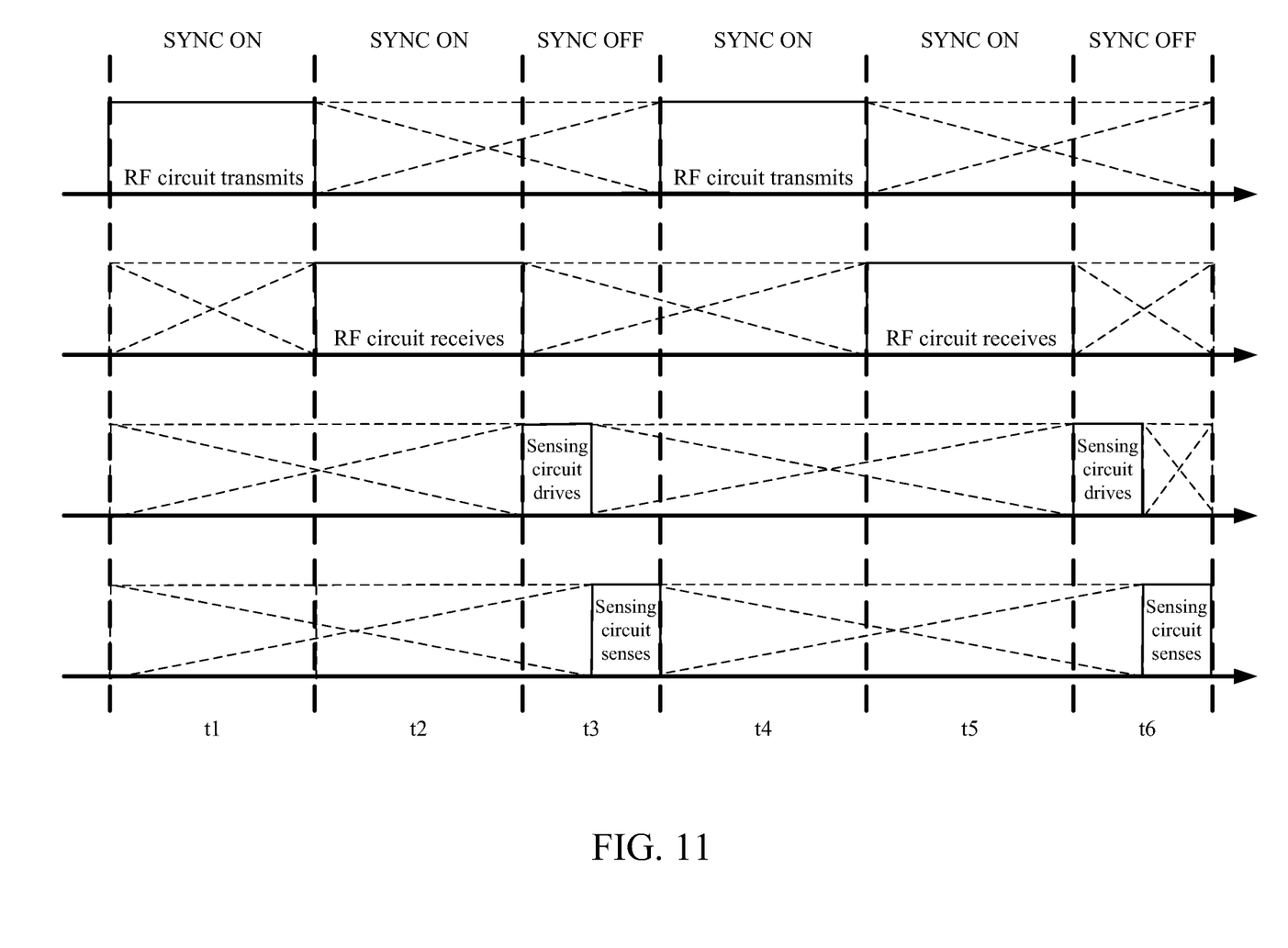
FIG. 11 shows a timing diagram of the operations of the sensing circuit and the RF circuit according to the sixth embodiment of the present invention.
Figure 12:
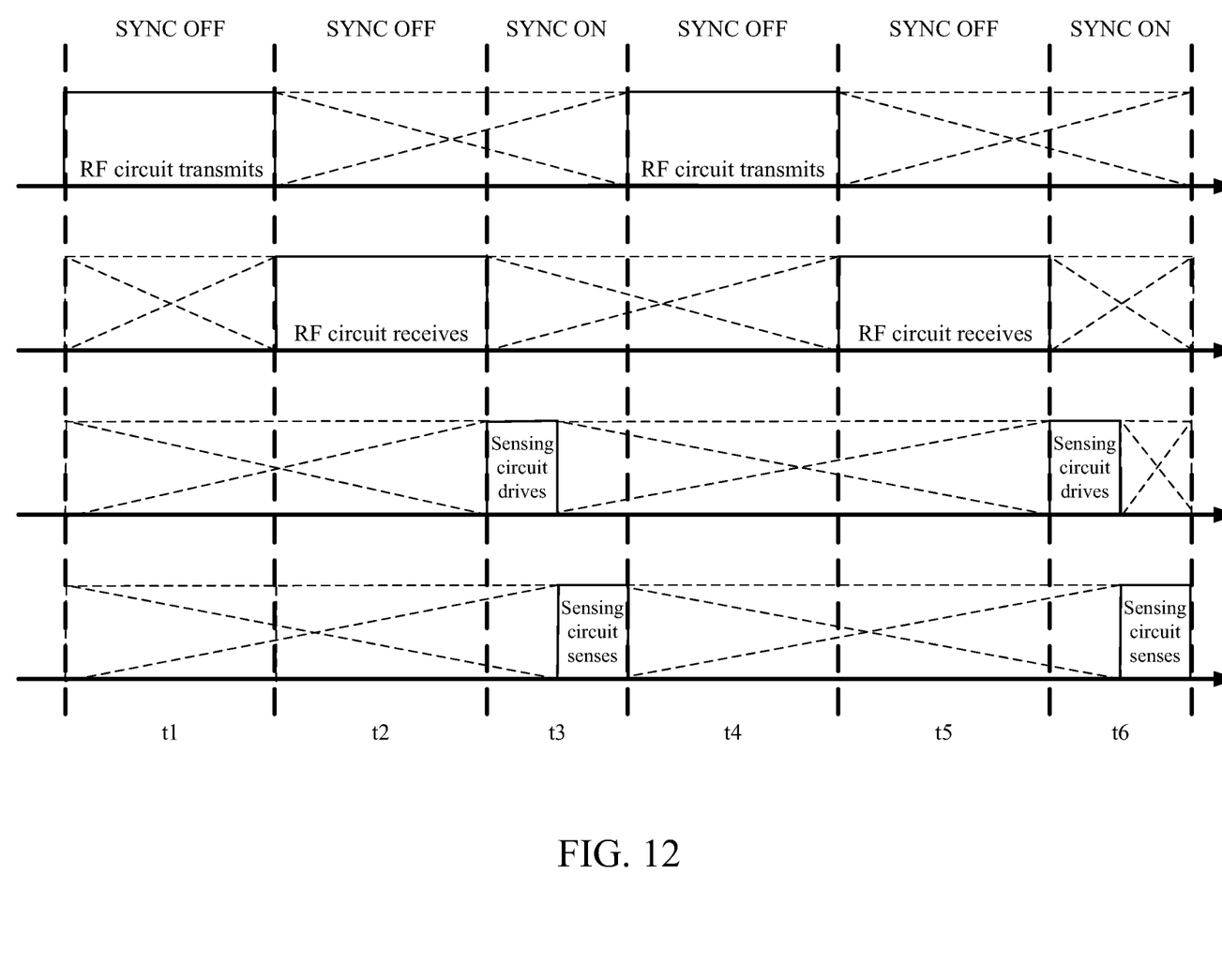
FIG. 12 shows a timing diagram of the operations of the sensing circuit and the RF circuit according to the seventh embodiment of the present invention.

Please refer to FIG. 11 and FIG. 12, which shows a timing diagram of the operations of the sensing circuit and the RF circuit according to the sixth and the seventh embodiment of the present invention. As shown in the figures, the RF circuit 31 will enter the idle state after transmitting the RF signal and receiving the wireless signal before it transmits the RF signal and receives the wireless signal again. When the RF circuit 31 is in the idle state, the sensing circuit 30 executes the driving task and the receiving task. According to the embodiment in FIG. 11, the level of the synchronization signal SYNC is the second level (SYNC OFF), which means that the RF circuit 31 is in the idle state and the sensing circuit 30 executes the driving task and the receiving task. According to the embodiment in FIG. 12, the level of the synchronization signal SYNC is the first level (SYNC ON), meaning that the RF circuit 31 is in the idle state and the sensing circuit 30 executes the driving task and the receiving task. According to the above embodiments, when the RF circuit 31 is in the idle state, the sensing circuit 30 can execute one of the driving task and the receiving task only.

To sum up, the present invention discloses a proximity sensor, which comprises a sensing element and a sensing circuit. The sensing element receives a first driving signal and a second driving signal, respectively, for generating a first sensing signal and a second sensing signal, respectively. The sensing circuit is coupled to the sensing element, transmits the first driving signal and the second driving signal to the sensing element, and generates a proximity signal according to the first sensing signal and the second sensing signal.

The present further discloses a proximity sensing method, which comprises executing a self-inductance sensing mode and a mutual-inductance mode for generating a self-inductance sensing signal and a mutual-inductance sensing signal, respectively; and generating a proximity signal according to the self-inductance sensing signal and the mutual-inductance sensing signal.

The present invention further discloses a proximity sensor, which comprises a sensing element and a sensing circuit. The sensing circuit is coupled to the sensing element and transmits one or more driving signal to the sensing element. The sensing element receives the one or more driving signal and generates one or more sensing signal. The sensing circuit generates a proximity signal according to the one or more sensing signal. The sensing circuit is further coupled to an RF circuit, and transmits one or more driving signal or/and receives one or more sensing signal corresponding to the state of the RF circuit.

However, the foregoing description is only embodiments of the present invention, not used to limit the scope and range of the present invention. Those equivalent changes or modifications made according to the circuit, structure, feature, or spirit described in the claims of the present invention are included in the appended claims of the present invention.

The invention claimed is:

1. A proximity sensor, comprising:
    a sensing element, receiving a first driving signal and a second driving signal, respectively, and generating a first sensing signal and a second sensing signal, respectively; and
    a sensing circuit, coupled to said sensing element, transmitting said first driving signal and said second driving signal to said sensing element, and generating a proximity signal according to said first sensing signal and said second sensing signal;
    wherein said first driving signal and said first sensing signal are a self-inductance driving signal and a self-inductance sensing signal, respectively; and said second driving signal and said second sensing signal are a mutual-inductance driving signal and a mutual-inductance sensing signal, respectively;
    said sensing element and said sensing circuit execute a self-inductance sensing mode and a mutual-inductance sensing mode, and said sensing element generates said self-inductance sensing signal and said mutual-inductance sensing signal, respectively; and
    said sensing circuit generates said proximity signal according to said self-inductance sensing signal and said mutual-inductance sensing signal.

2. The proximity sensor of claim 1, wherein said sensing element includes a first signal terminal and a second signal terminal; said first signal terminal and said second signal terminal are coupled to said sensing circuit; said sensing circuit transmits said first driving signal and said second driving signal to said first signal terminal and said second signal terminal, respectively; and said first signal terminal and said second signal terminal are different signal terminals.

3. The proximity sensor of claim 1, wherein said sensing element includes:
    a first sensing part, coupled to said sensing circuit, said sensing circuit transmitting said first driving signal to said first sensing part, and said first sensing part generating said first sensing signal corresponding to said first driving signal; and
    a second sensing part, coupled to said sensing circuit, adjacent to said first sensing part with a gap, said sensing circuit transmitting said second driving signal to said second sensing part, and said first sensing part generating said second sensing signal corresponding to said second driving signal.

4. The proximity sensor of claim 3, wherein said sensing element is an antenna; and said first sensing part and said second sensing part are a first antenna part and a second antenna part, respectively.

5. The proximity sensor of claim 1, wherein said sensing element is an antenna; said antenna is coupled to a radio-frequency circuit; said sensing circuit executes a driving task or/and a receiving task corresponding to the state of said radio-frequency circuit; when said sensing circuit executes said driving task, said sensing circuit transmits said first driving signal or said second driving signal; and when said sensing circuit executes said receiving task, said sensing circuit receives said first sensing signal or said second sensing signal.

6. The proximity sensor of claim 5, wherein when said radio-frequency circuit is in an idle state, said sensing circuit executes said driving task or/and said receiving task.

7. The proximity sensor of claim 5, wherein when said radio-frequency circuit is in a transmitting state, said sensing circuit executes said driving task, and said radio-frequency circuit transmits a radio-frequency signal to said antenna.

8. The proximity sensor of claim 5, wherein when said radio-frequency circuit is in a receiving state, said sensing circuit executes said receiving task, and said radio-frequency circuit receives a wireless signal received by said antenna.

9. The proximity sensor of claim 5, wherein a synchronization signal is transmitted between said radio-frequency circuit and said sensing circuit.

10. The proximity sensor of claim 1, wherein said sensing circuit is coupled to a communication module; said sensing circuit executes a driving task or/and a receiving task corresponding to the state of said communication module; when said sensing circuit executes said driving task, said sensing circuit transmits said first driving signal or said second driving signal; and when said sensing circuit executes said receiving task, said sensing circuit receives said first sensing signal or said second sensing signal.

11. The proximity sensor of claim 10, wherein when said communication module is in an idle state, said sensing circuit executes said driving task or/and said receiving task.

12. The proximity sensor of claim 10, wherein said communication module includes an antaean and a radio-frequency circuit; said radio-frequency circuit is coupled to said antenna; when said communication module is in a transmitting state, said sensing circuit executes said driving task, and said radio-frequency circuit transmits a radio-frequency signal to said antenna.

13. The proximity sensor of claim 12, wherein said communication module includes an antaean and a radio-frequency circuit; said radio-frequency circuit is coupled to said antenna; when said communication module is in a receiving state, said sensing circuit executes said receiving task, and said radio-frequency circuit receives a wireless signal received by said antenna.

14. The proximity sensor of claim 10, wherein a synchronization signal is transmitted between said communication module and said sensing circuit.

15. A proximity sensing method, comprising:
executing a self-inductance sensing mode and a mutual-inductance sensing mode, and generating a self-inductance sensing signal and a mutual-inductance sensing signal, respectively; and
generating a proximity signal according to said self-inductance sensing signal and said mutual-inductance sensing signal.

16. The proximity sensing method of claim 15, wherein said executing said self-inductance sensing mode is to transmit a self-inductance driving signal to a sensing element and receive said self-inductance sensing signal, and said sensing element generates said self-inductance sensing signal corresponding to said self-inductance driving signal; and said executing said mutual-inductance sensing mode is to transmit a mutual-inductance driving signal to said sensing element and receive said mutual-inductance sensing signal, and said sensing element generates said mutual-inductance sensing signal corresponding to said mutual-inductance driving signal.

17. The proximity sensing method of claim 16, wherein said sensing element include:
a first sensing part, receiving said self-inductance driving signal, and generating said self-inductance sensing signal corresponding to said self-inductance driving signal; and
a second sensing part, adjacent to said first sensing part with a gap, receiving said mutual-inductance driving signal, and said first sensing part generating said mutual-inductance sensing signal corresponding to said mutual-inductance driving signal.

18. The proximity sensing method of claim 16, further comprising:
executing a driving task or/and a receiving task corresponding to the state of a communication module, wherein executing said driving task is to transmit said self-inductance driving signal or said mutual-inductance driving signal, and executing said receiving task is to receive said self-inductance sensing signal or said mutual-inductance sensing signal.

* * * * *